United States Patent [19]

Lamoureux

[11] 4,316,127
[45] Feb. 16, 1982

[54] PROCESS FOR MAINTAINING AN ELECTRIC OSCILLATION CIRCUIT AND HORIZONTAL DEFLECTION DEVICE FOR A CATHODE-RAY TUBE

[75] Inventor: André Lamoureux, Brunoy, France
[73] Assignee: Videocolor, S.A., Montrouge, France
[21] Appl. No.: 230,827
[22] Filed: Feb. 2, 1981

[30] Foreign Application Priority Data

Jan. 31, 1980 [FR] France .................... 80 02055
Nov. 5, 1980 [FR] France .................... 80 23586

[51] Int. Cl.$^3$ .................... H01J 29/70; H01J 29/76
[52] U.S. Cl. .................... 315/408; 315/399
[58] Field of Search .................... 315/399, 408, 411

[56] References Cited

FOREIGN PATENT DOCUMENTS 5391 4/1979 European Pat. Off. .
2118894 4/1972 France .
1502074 2/1978 United Kingdom .

OTHER PUBLICATIONS

Peruth and Schrenk, Pumpschaltungein Fortschrittliches Transistorkonzept fur Fernsehempfanger, *Siemens Bauteile Report*, vol. 12, 1979, No. 3.
Dietz and McNulty, Comparison of Transistor and SCR Deflection Circuits for Color Television, *IEEE Transactions on Consumer Electronics*, vol. CE-22, No. 4, Nov. 1976.

*Primary Examiner*—Theodore M. Blum
*Attorney, Agent, or Firm*—Pollock, Vande Sande & Priddy

[57] ABSTRACT

Improvements to combined power supply and horizontal deflection devices in a television receiver.

According to the invention, the line transformer includes a winding $W_1$ for maintaining an oscillation circuit including the deflector Ly of the cathode-ray tube and a winding $W_2$ which may be connected to a power supply source E through a controlled switch $I_2$; the winding $W_1$ is not effectively put into service for the sweep until a switch $I_3$ or $I'_3$ using a diode $D'_3$ with a relatively long recovery time and operating in phase opposition with respect to $I_2$ is closed, so that the temporary short-circuit of winding $W_1$ during a sweep trace is not felt by the power supply source E.

The invention mainly permits powering all the circuits of a television set from a single transformer, the line transformer.

16 Claims, 4 Drawing Figures

PROCESS FOR MAINTAINING AN ELECTRIC OSCILLATION CIRCUIT AND HORIZONTAL DEFLECTION DEVICE FOR A CATHODE-RAY TUBE

FIELD OF THE INVENTION

The invention concerns a process for maintaining an oscillation circuit for the line sweep of a cathode-ray tube, as well as an arrangement providing horizontal deflection for such a cathode-ray tube employing said process. More particularly, the subject of the invention is the use of a single transformer, called a line transformer, not only for purposes of maintaining the oscillation which includes the cathode-ray tube line deflector but also in order to obtain from the same transformer, by means of additional windings, a number of stabilized or unstabilized supply voltages needed for the operation of the device in which said cathode-ray tube is used, especially a television receiver.

BRIEF DESCRIPTION OF PRIOR ART

Modern television sets, particularly color television receivers, are often provided with peripheral remote control units connected to the television set. This makes it necessary to carefully insulate the chassis sector of the apparatus so that no peripheral unit comes into contact with the potential of that sector, which could be dangerous to the user.

Furthermore, there have been efforts made in the past to combine the television power supply circuits with the horizontal deflection circuit inducing the line sweep on the cathode-ray tube. In this case the deflection circuit, in particular the line transformer, is provided with extra windings furnishing the different sources of power needed for the operation of the television set; the supply transformer properly speaking is eliminated. There is a drawback to this system, however, stemming principally from the fact that one controlled switch is integral with the oscillation circuit that includes the line deflector (this oscillation circuit consists in said deflector, constituted by an induction coil, and two condensers) for purposes of short-circuiting one of the components of the oscillation circuit during a sweep trace, when the oscillation circuit is operating at a low oscillation frequency in comparison to another oscillation frequency established during the retrace. In fact, this controlled switch has also the effect of short-circuiting one "keep-alive" winding of the line transformer, which presents problems if another winding of the very same transformer is simultaneously connected to a power source from the sector. Conceivably, this problem could be resolved by establishing a relatively loose coupling between the two windings of the line transformer referred to above, but such a solution appears unsatisfactory because of its low efficiency and especially because of substantial parasitic radiation around the line transformer, which might cause interference with the adjacent electronic circuits and above all with the cathode-ray tube itself.

BRIEF DESCRIPTION OF PRESENT INVENTION

The invention provides a satisfactory solution both to the problem of galvanic insulation between the sector and the various components of the television set and to the problem of integrating the supply function with the horizontal deflection methods used in that television set.

In this spirit, the invention principally concerns a process for maintaining an electric oscillation circuit with two sequentially commutable oscillation frequencies for the line sweep of a cathode-ray tube, of the type inducing the "keep-alive" energy level in a first inductive winding connected to said electric oscillation circuit at the common terminal of two of that circuit's condensers, with the lowest oscillation frequency being established for the sweep trace period of the sweep cycle when that condenser is short-circuited and the highest oscillation frequency being established during the retrace period of the sweep when that condenser is not short-circuited, said process being characterized by the fact that, by means of a second inductive winding which may be connected to a source of continuous voltage and coupled to said first winding with a high electromagnetic coupling coefficient by means of a magnetic circuit, it consists in:

interconnecting the aforesaid second winding to the terminals of said continuous voltage source during each sweep trace period referred to above until a predetermined energy level is reached in said magnetic circuit, while keeping the aforesaid first winding disconnected;

disconnecting said second winding when said energy level is reached, preferably while simultaneously connecting said first winding to the terminals of the aforesaid short-circuited condenser until the end of the said sweep trace period if the energy level referred to is reached before the end of that sweep trace period;

breaking the short-circuit at the terminals of said condenser during the entire retrace period, while keeping the aforesaid first winding connected during at least part of that retrace period; and again disconnecting the aforesaid first winding, preferably at the end of the retrace, and connecting the aforesaid second winding to the terminals of said source of continuous voltage, preferably simultaneously.

Of course, the source of continuous voltage referred to is simply a rectifier bridge, a diode bridge for example, connected to the chassis sector and wired to the said second winding via suitable filtering devices. In order to achieve one of the objectives of the invention, this source of continuous voltage must be galvanically insulated from the rest of the television chassis.

The invention also concerns a power supply and horizontal deflection device for a cathode-ray tube of the type including:

an oscillating circuit wired to a first inductive winding and including the deflector for said cathode-ray tube as well as two condensers, one of these condensers being connected between a connection terminal of the said first winding to the said oscillating circuit and to a reference potential terminal;

a first controlled switch connected to the terminals of that condenser in order to short-circuit it during each sweep trace period and to place it in service in the aforesaid oscillating circuit during each retrace period of the sweep; and a second inductive winding coupled to said first winding by a magnetic circuit and connected to a source of continuous voltage through a second controlled switch;

said arrangement being characterized by the fact that the magnetic coupling between the first and second winding is close and by the fact that it also includes a third switch in series with the aforesaid first winding between the said reference potential terminal and the said connection terminal. According to a first mode of realization, the third switch is a controlled switch, and drive mechanisms are provided to drive said second and third controlled switches in phase opposition.

In order to achieve one of the goals of the invention, the power supply source mentioned above, the second inductive winding and the second controlled switch are galvanically insulated from the remainder of the chassis of the apparatus.

Moreover, each of the controlled switches mentioned above is preferably a bidirectional switch which has a controllable conduction direction. In the examples to be described later, a switch of this type consists of a transistor and a diode with a short recovery time connected with reverse polarity between the collector and the emitter of that transistor; the base of the transistor constitutes a command input for said switch. Conceivably, it is also possible to replace the transistor by a thyristor or any other suitable semiconductor device. The above-used term "bidirectional switch which has a controllable conduction direction" means simply that such a switch can conduct in either direction if a validation signal is applied to its command input, but that this switch may spontaneously conduct in either direction without it being necessary to apply a validation signal to the command input. It will be seen that the use of such switches significantly simplifies the drive circuits of the various switches, taking advantage of the laws of electromagnetism governing the phenomena which occur inside the line transformer. According to a second mode of realization, the third controlled switch referred to above is replaced to good advantage by another type of "switch" which requires no particular control arrangement, the drive of this "switch" being ensured just by the changes in polarity occurring periodically and automatically in the line transformer as a result of the activation of the two other controlled switches.

To good advantage, this third switch is, according to the invention, a simple diode with a relatively long recovery time, taking into account the characteristic cycling time of the oscillating circuit including the deflector. In fact, for a deflector repetition rate on the order of 15 KHZ, it is necessary to use so-called "rapid" diodes (i.e., those with a particularly short recovery time) in the circuits where such a rate occurs so that the diode is immediately blocked once reversed voltage is registered at its terminals. It is known that the recovery time of a diode is the precise interval of time during which its conductivity is reversed before it is blocked when reverse voltage is applied to its terminals after it has been conducting in the direct sense for a given time. It is the time required for the recombination of the carriers in the junction. In this case, the third switch according to the second mode of realization is only comprised of a "slow" diode.

This substitution is possible because the conduction time for each cycle imparted to the transistor of the third controlled switch according to the first mode of realization corresponds to only half of the line retrace period, and that this relatively brief conduction time is of the order of magnitude of the recovery time of a diode of the type customarily intended for the reversal of alternating current in a 50 HZ or 60 HZ power supply system.

The invention will be more readily understood and other of its purposes, details and advantages will be apparent in the light of the following description of two modes of realization of an arrangement in conformity with the invention, said description being provided solely by way of example and with reference to the nonrestrictive attached drawings in which:

DETAILED DESCRIPTION OF THE INVENTION

Figure 1:
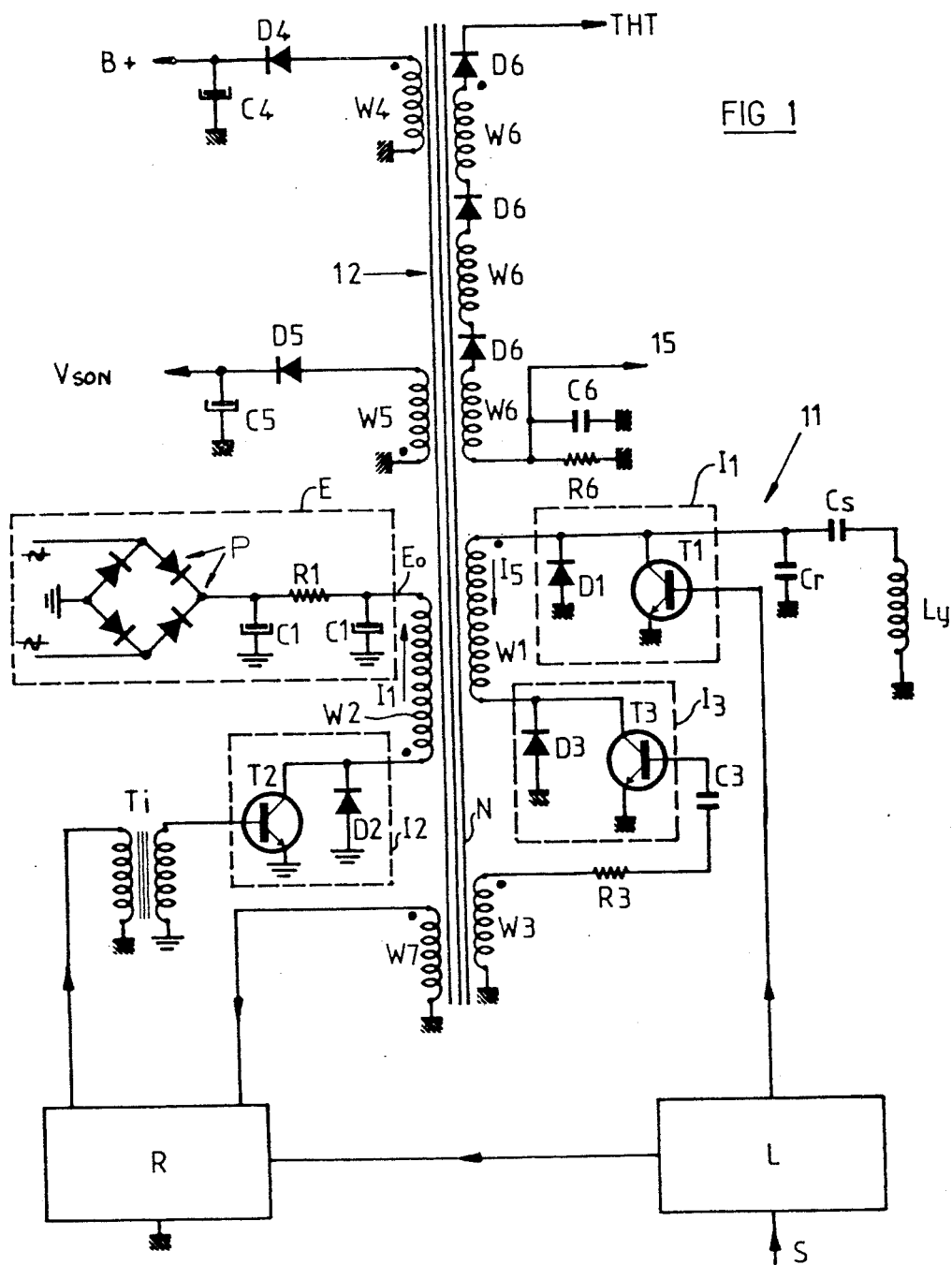
FIG. 1 is a general circuit diagram of a first mode of realization of an arrangement for powering and providing horizontal deflection in a cathode-ray tube.

Referring now to FIG. 1, we find represented in particular a horizontal deflection arrangement 11 for a non-represented cathode-ray tube and entailing a deflector Ly which is interconnected with two condensers Cs and Cr to form an oscillating circuit which can function sequentially at two different oscillation frequencies so that the current passing through the deflector Ly is sawtoothed. More specifically, one of the terminals of the deflector Ly is connected to the main chassis, i.e., to a reference potential, and the other terminal is wired to a connection in series with two condensers Cs and Cr, one of the terminals of condenser Cr also being wired to the main chassis. In addition, a controlled switch $I_1$ is connected in parallel with condenser Cr. The capacitance of condenser Cs is substantially greater than that of condenser Cr. The switch $I_1$ is of the bidirectional type controllable in one direction of conduction. As noted above, this switch may include a transistor T1 whose collector is connected at the common terminal of the condensers Cr and Cs and whose emitter is connected to the chassis mass (here the transistor T1 is of the NPN type) and to a diode $D_1$ with a relatively short recovery time, itself connected with reverse polarity between the collector and the emitter of the transistor $T_1$, i.e., with its cathode wired to the collector of the transistor. The base of the transistor $T_1$ constitutes the control input for switch $I_1$ and is connected to a line oscillator L driven by synchronization pulses applied at the input S of said oscillator. One of the ends of a first inductive winding $W_1$ is connected to the aforementioned oscillating circuit, more particularly to the common terminal of condensers Cs and Cr.

The winding $W_1$ is part of the line transformer 12 and is coupled by a magnetic circuit made up of the core N of said transformer to a second inductive winding $W_2$ connected to a source of continuous voltage E through a second controlled switch $I_2$, identical to switch $I_1$. More specifically, the continuous voltage source E consists in a four-diode bridge rectifier P, wired to the chassis sector, and in a resistance-capacitance filter $(R_1, C_1)$ whose output $E_0$ is connected to one end of the coil $W_2$; the other end of this coil is wired to a non-galvanically insulated sector mass through the switch $I_2$. This uninsulated sector mass is of course thoroughly insulated from the chassis mass referred to previously. In FIG. 1, the grounded points on the sector are symbolized by horizontal lines inside a triangle, while the points on the chassis mass are symbolized by slanted lines inside a rectangle. The base of the transistor $T_2$ of the switch $I_2$ constituting the command input for said switch is therefore connected to a winding of an insulation transformer $T_i$ whose other wrapping receives the control signals generated by a regulating unit R, of a known type, which unit receives its error voltage from an auxiliary winding $W_7$ wrapped around the core N. The line oscillator L is also connected to an input on the regulating unit R so as to synchronize its functioning.

According to an important characteristic of the invention, the coupling between the windings $W_1$ and $W_2$ is close. In practical terms, consideration can be given to winding these two windings on the same "leg," the core of the transformer 12. Furthermore, in a preferred mode of realization of the invention, all the windings of the transformer 12, including those to be described below, are wound on the same "leg," the core of the line transformer, which more or less has the shape of a ferrite frame with a broad opening, in accordance with a customary mode of realization of a line transformer.

According to another important characteristic of the invention, the arrangement in FIG. 1 also includes a third controlled switch $I_3$ inserted in series with the winding $W_1$ between the chassis mass and the point at which the winding $W_1$ and the oscillating circuit are connected. Preferably, the switch $I_3$ is inserted as shown in FIG. 1 between the terminal of winding $W_1$ which is not connected to the oscillating circuit and the mass of the television chassis. If we examime the transistor $T_3$ of the switch $I_3$, its collector is thus wired to the winding $W_1$ and its emitter is connected to the chassis mass. The diode $D_3$ with a relatively short recovery time is wired between the collector and the emitter of transistor $T_3$. The base of transistor $T_3$, which constitutes the command input for the switch $I_3$, is wired to an additional winding $W_3$ (through a connection in series with a resistor $R_3$ and condenser $C_3$) wound on the core N and whose other end is connected to the chassis mass. Of course, according to the foregoing, the coupling between the winding $W_1$ and the winding $W_3$ is close.

Finally it will be noted that, in a classical manner, the power source THT consists in several windings $W_6$ wound about the core N and interconnected in series by means of diodes $D_6$. As will be seen below, these elements provide the high voltage for the cathode-ray tube (THT) by means of rectification during the line retrace. One of the windings $W_6$ is connected to the chassis mass through a connection in parallel with a resistor and a condenser $(R_3, C_3)$ making it possible to pick up a signal representing the current flow through the source THT at its output 15. Another winding $W_4$ has one of its ends connected to a diode $D_4$ in order to provide a stabilized voltage B+ filtered by a condenser $C_4$. As will be seen below, this voltage is stabilized because the winding $W_4$ discharges only during the line retrace periods; the peak voltage developed at the terminals of winding $W_1$ (which then behaves as a primary with respect to winding $W_4$) is stabilized thanks to the regulation unit R. Another winding $W_5$ is also wound around the core N and connected to a diode $D_5$ which charges a filtering condenser $C_5$ so as to furnish an unstabilized voltage Vson intended to feed the low frequency stages of the television set. As will be noted below, this voltage is not stabilized (it need not be) because the winding $W_5$ is discharging only during the sweep trace periods.

In this connection, not that the direction of the windings on the transformer 12 are not unimportant, as the analogous terminals of each winding are marked in the traditional manner by a dot in the diagram of FIG. 1. It may thus be noted that windings $W_1$, $W_3$, $W_4$, $W_6$ and $W_7$ are all wound in the opposite direction from windings $W_2$ and $W_5$. Of course, a reversal of the winding of one of these windings accompanied by a reversal of the connections at its terminals changes nothing. FIG. 1 and the directions of the windings as indicated therein simply show that if, for example, a positive voltage is applied to the terminals of winding $W_1$ acting as primary, a voltage of like polarity will be engendered at the terminals of windings $W_3$, $W_4$, $W_6$ and $W_7$, but, on the other hand, a negative voltage will be induced, for example, at the terminals of winding $W_5$.

Figure 2:
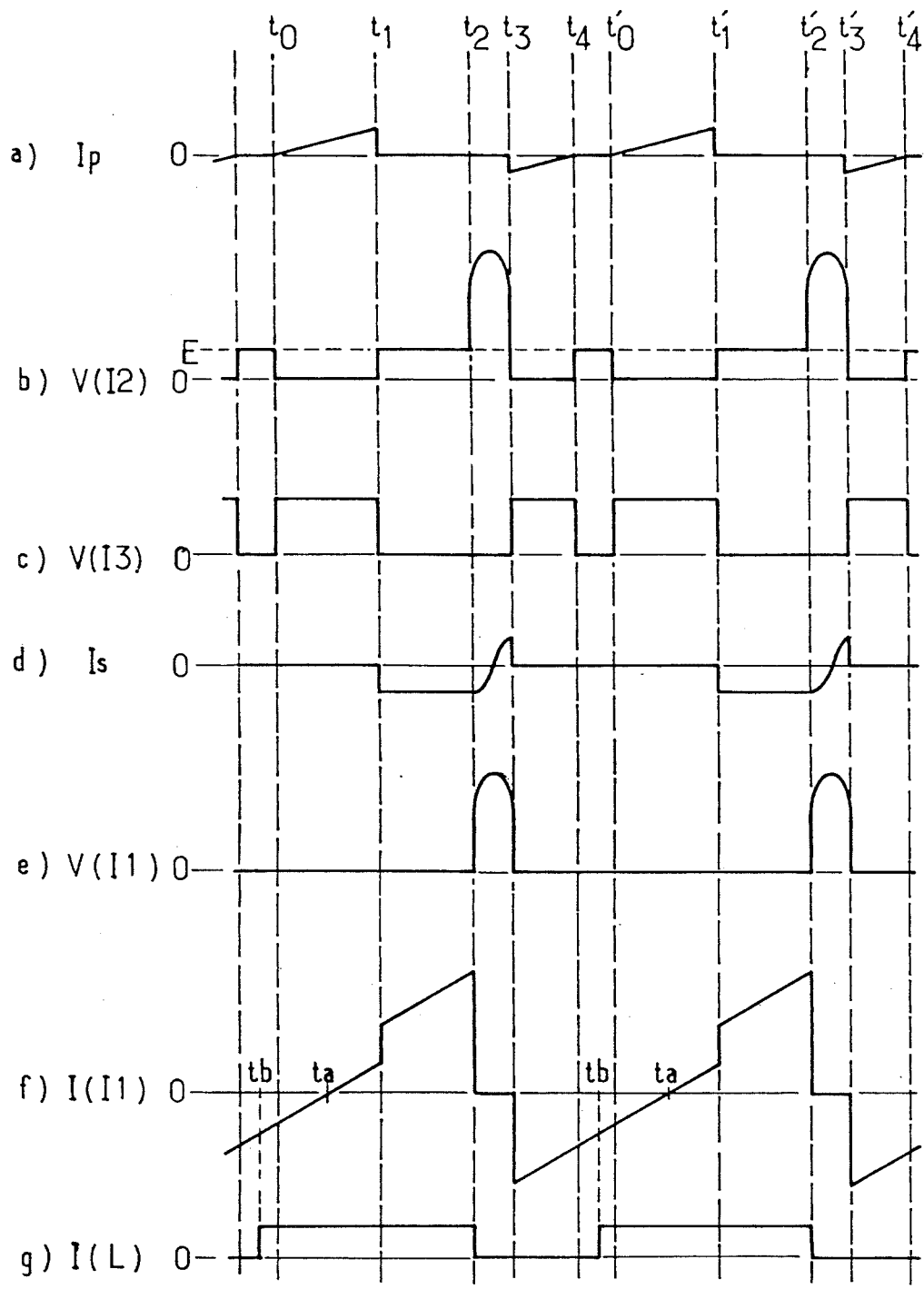
FIG. 2 is a chronogram illustrating the operation of the arrangement of FIG. 1.

Now to be described is the operation of the arrangement just described, this by referring to the chronogram in FIG. 2. In this chronogram:

FIG. 2a represents the current $I_p$ in winding $W_2$;

FIG. 2b represents the voltage V ($I_2$) at the terminals of switch $I_2$;

FIG. 2c represents the voltage V ($I_3$) at the terminals of switch $I_3$;

FIG. 2d represents the current Is in winding $W_1$;

FIG. 2e represents the voltage V ($I_1$) at the terminals of switch $I_1$;

FIG. 2f represents the current I ($I_1$) passing through the switch $I_1$; and

FIG. 2g represents the base current I (L) of the transistor $T_1$, i.e., the control signal applied by the oscillator L at the command input of the switch $I_1$.

Furthermore, the different characteristic moments of the operation of the arrangement in FIG. 1 are referred to on the abscissa. Since the chronogram of FIG. 2 represents essentially two complete operating cycles of the arrangement, a characteristic moment may be analyzed without distinction at either time $t_i$ or time $t'_i$.

We shall first examine the operation of the line deflector Ly in conjunction with the condensers Cs and Cr with which it is able to define two oscillating circuits with different oscillation frequencies depending on the status of the switch $I_1$. The condenser Cs has a capacitance significantly greater than that of the condenser Cr, but the switch $I_1$ is connected in parallel with the condenser Cr, so that it is condenser Cs which defines, with the inductance of the deflector Ly, the frequency of oscillation during a sweep trace period, whereas the frequency of oscillation during the retrace (higher) is defined by the inductance of the deflector Ly and the capacitance of the condenser Cr. During the sweep trace when the condenser Cr is short-circuited, the transistor $T_1$ may be opened up at a noncritical moment after the sweep begins because the direction of the current in the deflector Ly is such that the oscillating circuit Ly, Cs is reclosed by the diode $D_1$ which is conducting measurably during the first half of the sweep trace, so long as the current is "negative" in accordance with curve f, i.e., until moment $t_a$. The transistor $T_1$ is put in its initial conductive condition before this moment (at tb) by the rising front of the pulse delivered by the line oscillator L (curve g) so that when the diode $D_1$ is automatically locked out when the current changes direction in the deflector Ly at moment $t_a$, the oscillating circuit Ly, Cs may continue to oscillate by virtue of the fact that $T_1$ is saturated until point $t_2$ (or $t'_2$), this moment being marked by the descent edge of the signal delivered by the line oscillator L which initiates the retrace of the sweep. At this instant, $t_2$, the transistor $T_1$ is locked out. At this time the oscillating circuit changes its characteristic frequency because it then consists essentially in the deflector Ly and the condenser Cr. Of course, said condenser Cr is discharged at the start of the retrace sweep. However, the current in the deflector Ly is at a high level so that this inductance is discharged in the condenser and the current in Ly will decrease gradually (Ly "charging" Cr) while causing a "positive" voltage, i.e., blocking the diode $D_1$, at the terminals of the condenser Cr; thus the energy of the induction of the deflector Ly cannot be transferred except to condenser Cr since the switch $T_1$ is open. Accordingly, the current in the deflector Ly will decrease gradually until it is nil, in the middle of the line retrace. At this precise instant (the middle of the line retrace), energy is thus at its maximum level in the condenser Cr, which will begin to discharge into the deflector Ly causing a current to flow there in the opposing direction, this until the end of the line retrace.

At this moment ($t_3$ or $t'_3$), the energy in the deflector is again at a peak but the current is reversed. This meets the conditions for the automatic stoppage of the retrace sweep because, when the deflector Ly is again going to start its discharge process, it can happen only by charging the condenser Cr with a "negative" polarity which immediately results in the diode $D_1$ being in the conducting state, in other words, in the automatic closing of the switch $I_1$. As from this moment, the operating conditions, in particular the oscillation frequency of the line sweep circuit, again change because the condenser Cr is again short-circuited. A new sweep trace cycle is thus begun with an oscillating circuit (Ly Cs). Note that at the end of the retrace (instant $t_3$, $t'_3$), there is absolutely no need for the transistor $T_1$ to be saturated since the condenser Cr is short-circuited automatically when diode $D_1$ begins conducting. The conduction of the transistor $T_1$ will not be involved until later, at the moment during the rising front of the line oscillator L signal, so that the transistor $T_1$ is prepared to conduct at the moment (ta) when the current in the switch $I_1$ changes directions (curve f), i.e., when the diode $D_1$ no longer provides conduction.

Further, note that the winding $W_1$ is in fact connected, during the retrace, to the terminals of an energy source constituted by the oscillating circuit (Ly, Cr); the condenser Cr is developing a positive voltage at the terminals of the winding $W_1$, because the switch $I_3$ is closed, and the other end of winding $W_1$ is thus connected to the chassis mass. More specifically, during the first part of the retrace, the switch $I_3$ will be closed by the initial conduction of the diode $D_3$ at $t_1$ and subsequently, when the current Is changes sign in the winding $W_1$, by the saturated transistor $T_3$, which will have been placed in preconduction status since the start of the retrace thanks to the winding $W_3$ applying at its base a pulse of positive voltage of the same nature as that developed at the terminals of the open switch $I_1$ (curve e) inasmuch as the winding $W_1$ behaves at this time like a "primary" for the winding $W_3$.

At the end of the line retrace, the base of transistor $T_3$ is no longer powered (V ($W_3$)=0) and, as a result, transistor $T_3$ is locked out at moment $t_3$ (curve d) and all the voltages at the terminals of the various windings are suddenly reversed. As a consequence, the diode $D_2$ is instantly in a conducting status, which is reflected in the immediate appearance of current in winding $W_2$ (curve a, moment $t_3$). This point should be stressed as it may be noted, in comparing curves d and a, that the system is designed so that switches $I_2$ and $I_3$ operate naturally in phase opposition; the change in the status of the switch $I_3$ at moment $t_3$ results in the changed status of switch $I_2$ by the simple effect of the laws of electromagnetism, which dictate that, when the current circulating in a coil is cut off, a reverse voltage immediately appears at its terminals. Consequently, the sudden cutoff of a sizable current Is in the winding $W_2$ (curve d) at the end of the line retrace ($t_3$) is instantaneously compensated by the appearance of a current $I_p$ in winding $W_2$. There is thus conservation of the ampere turns in the magnetic circuit constituted by the core N which, otherwise (i.e., if the current $I_p$ where unable to circulate in the winding $W_2$ because the switch $I_2$ does not open simultaneously), would be dissipated in the form of heat while engendering overvoltages in the other windings $W_4$, $W_5$, $W_6$, etc. In other terms, the fact that one winding ($W_2$) is precisely in the conducting status at the precise moment when another winding ($W_1$) is disconnected ensures that there will be a transfer to winding $W_2$ of all the energy stocked in winding $W_1$, thereby keeping that energy from being distributed, especially to the other windings, causing harmful overvoltages in them.

Starting at instant $t_3$, the winding $W_1$ thus plays its role as primary, but the current (which is "negative" is shown in curve a) which is suddenly established in this winding when the diode $D_2$ begins to conduct is of reverse polarity vis-a-vis the current which the source of continuous voltage E tends to impose at the other terminal of this winding. Consequently, for a certain time interval ($t_3-t_4$), the current in winding $W_2$ is decreasing in absolute value until it becomes nil and remains nil until transistor $T_2$ is closed, the command for which is generated by the regulating unit R whose operation will be analyzed later. From moment $t_4$ when transistor $t_2$ begins to conduct (moment $t'0$), the transformer is under no load and the voltages at the terminals of windings $W_1$, $W_2$ are nil. This time interval is more or less long and depends on the control signals generated by the regulating unit R. At the command to close the transistor $T_2$, the current imposed by the source E will increase for the entire time interval $t'0-t'1$, when the regulating devices will maintain the conduction of the transistor $T_2$. The energy stored during this time in winding $W_2$ thus depends only on the voltage of source E and the time interval $t'0-t'1$ which may vary depending on how it is regulated, especially in order to compensate for possible variations in the sector voltage. When transistor $T_2$ opens, the current in winding $W_2$ is suddenly cut off and the conditions again exist for a simultaneous and phase-opposed commutation of the switches $I_2$ and $I_3$. In fact, when the current in winding $W_2$ is suddenly cut off (curve a, moment $t'1$), the voltages at the terminals of winding $W_1$ and the other windings are suddenly reversed, which instantaneously puts diode $D_3$ in the conducting state (in other words, the switch $I_3$ closes automatically) and, as this occurs during a sweep trace period, the switch $I_1$ is closed so that a current may instantaneously pass through winding $W_1$, whose terminals are short-circuited. For the same reasons described above, any dissipation or overvoltage is avoided in the system by the fact that one winding ($W_1$) is caused to conduct at the precise moment the current is cut off in another winding ($W_2$). Another important characteristic of the invention also becomes clearly apparent at the present stage of description of the operation, namely that winding $W_1$ is never short-circuited (switches $I_3$ and $I_1$ closed at the same time) when winding $W_2$ is effectively connected to the power source E ($I_2$ closed), which makes possible a very close coupling between windings $W_1$ and $W_2$ (as noted earlier, windings $W_1$ and $W_2$ may to good advantage be wound on the same "leg" of the core or magnetic circuit of the line transformer) and, consequently, a very low level of line transformer radiation is ensured and poses no risk of interfering with the operation of the other elements of the television set, especially the cathode-ray tube which is extremely sensitive to parasitic fields. During time interval $t'_1-t'_2$—the length of which may be varied by regulating unit R—the winding $W_1$ again has its role of "primary" but carries out no functions other than conserving the energy in the core N of the line transformer at the level at which it had provisionally been stored during time interval $t'_0-t'_1$.

Thereafter, the descending front of the pulse generated by the line oscillator L controls the opening of the switch $I_1$ at moment $t'_2$ and a new retrace is initiated in accordance with the process described earlier.

Now to be described is the rule of the regulating unit R which may be fulfilled by any known control system able to cause the moments $t_0$ and/or $t_1$ to vary in each cycle. The principal objective of this regulation is to stabilize the current in the deflector Ly, and it has already been indicated above that the invention also makes it possible to obtain stabilized voltages as well to provide the high tension (THT) required by the operation of the cathode-ray tube and to power the various electronic circuits of the television set ($W_4$, $D_4$). To do this, one might choose to directly stabilize the current passing through the deflector Ly by means of a control device. It is preferred, however, to take as the regulating value the peak voltage at the terminals of the condenser Cr during the line retrace, i.e., when switch $I_1$ is open, as this voltage is proportional to the current passing through the deflector Ly. However, as this voltage is also the voltage observed at the terminals of winding $W_1$, and may be very high (on the order of 1,500 volts), it is preferred to use a dummy voltage generated at the terminals of winding $W_7$ (involving an appropriate number of turns) as the regulation voltage for the regulating unit R, this because during the line retrace winding $W_1$ plays the role of the primary for winding $W_7$, and because the voltage developed then is directly proportional to the current passing through the deflector Ly. No phase difference is recorded between the voltage at the terminals of winding $W_1$ and the voltage resulting at the terminals of winding $W_7$, during the line retrace, as the coupling between the two windings is close. The regulating system proper will not be described in detail as it is conventional. It will be specified, however, that by way of example the peak voltage at the terminals of winding $W_7$ may be transformed into a continuous voltage serving to develop an error voltage by comparison with a reference voltage (provided by a Zenner diode) by means of a differential amplifier; the output of this differential amplifier associated with the output of a ramp generator driven by the oscillator L command a Schmitt trigger. The output signal of the Schmitt trigger is of course used to command transistor $T_2$ through the insulation transformer $T_i$.

Another aspect of the mode of operation of the arrangement according to the invention concerns the necessary reinjection of energy into the oscillating circuit of the line deflector Ly in order to compensate for losses. This reinjection is produced automatically during the line retrace and the difference in intensity, in terms of absolute values, in the current Is between the start ($t_2$) and the finish ($t_3$) of the line retrace, visible in FIG. 2d, represents in particular the compensated losses in the oscillating circuit of the deflector.

At this stage of the analysis of the operation of the arrangement in FIG. 1, the basic concept of the invention can be clearly distinguished: it consists in a time-shared use of a single magnetic component; this time-shared use is made possible particularly by attaching the switch $I_3$ in series with winding $W_1$. The following principal operating phases may be distinguished:

connecting winding $W_2$ (switch $I_2$ closed) to the terminals of a power source (E) during a more or less long time period during the sweep trace in order to establish a desired energy level in the core of the line transformer, the winding $W_1$ being disconnected so that the latter, which then plays the role of secondary in relation to winding $W_2$, is not in a dead short-circuit status during this time due to the fact that the switch $I_1$ is closed during the entire sweep trace period;

disconnecting winding $W_2$ from the power source (switch $I_2$ open) when said energy level is reached and using winding $W_1$ to prevent the dissipation of the previously stored energy by virtue of the Joule effect, this while permitting a current to be established in the short-circuited winding $W_1$;

putting winding $W_1$ back into service for the sweep during the line retrace (switch $I_1$ open and switch $I_3$ closed) when its role is essential for keeping alive the oscillating circuit, and possibly using this winding $W_1$ as primary winding during this period for purposes of powering (in a known manner) other windings of the line transformer, especially to provide different feed voltages to the television set or cathode-ray tube.

Finally, one last important advantage of the invention should be noted, namely the possibility of obtaining the supply voltage for the sound reproduction stages of the television set from the line transformer. In fact, these stages operate in low frequency ranges and therefore do not require high current peaks. Now, with the arrangement represented in FIG. 1, it is apparent that winding $W_5$ is wound "in reverse" as compared to the other windings such as $W_4$ and $W_6$, which means that the diode $D_5$ will be unblocked and can charge the condenser $C_5$ only during the sweep trace periods. As a consequence, the energy needed for the sound reproduction stages is not taken from the line transformer except at times other than the retrace periods of the sweep. The low frequency operation of these sound reproduction stages therefore presents no risk of interfering with the regulating unit R inasmuch as the winding $W_5$ is discharging only during the sweep trace when the line transformer core is uncoupled from the sweep function proper as a result of the timeshared utilization of said line transformer, which is possible only thanks to the presence of switch $I_3$ at the end of winding $W_1$—a key special feature of the invention. The fact the voltage rectified by the diode $D_5$ is not stabilized is not critical, in that as the powering of circuits operating in low frequency classes is involved, it is sufficient simply to provide a condenser $C_5$ with sufficient capacitance to ensure effective filtering. Thanks to the invention, it is thus possible for the first time to power the sound reproduction stages of a television set from a winding wound about the line transformer. Since, moreover, the powering of the cathode-ray tube filament from several spires wound about the same magnetic circuit poses no problems, we thus have, for the first time, the possibility of obtaining all the voltages required for the operation of the television set from a single magnetic power component, namely the line transformer.

Figure 3:
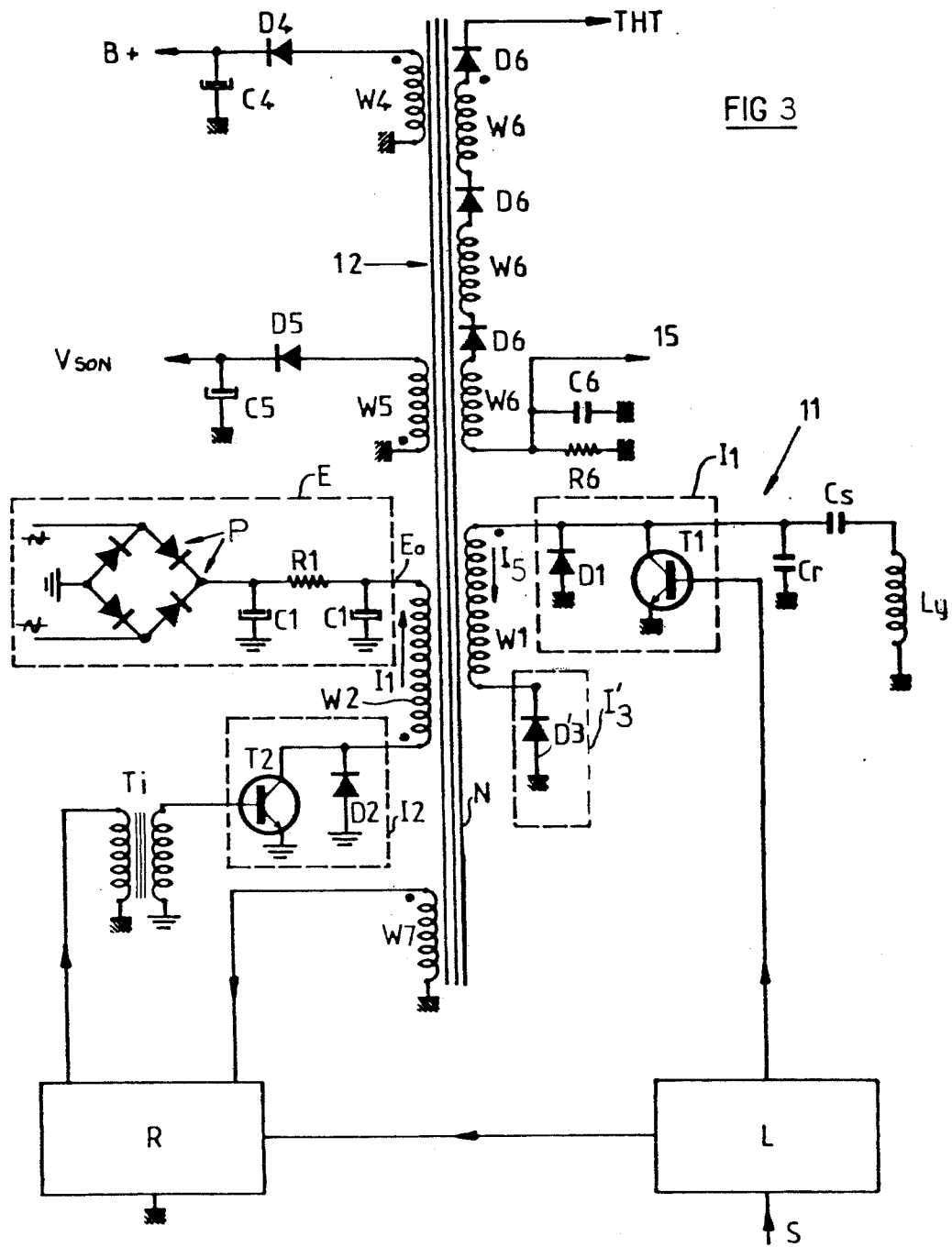
FIG. 3 is a general circuit diagram of a second mode of realization of an arrangement for powering and providing horizontal deflection in a cathode-ray tube.

The second mode of realization is represented in FIG. 3, where those components which are analogous bear the same reference numbers as in FIG. 1.

The only noteworthy difference is in the arrangement of the third switch $I'_3$, which replaces the controlled switch $I_3$ of FIG. 1. As mentioned above, the switch $I'_3$ is reduced to a single diode $D'_3$ with a relatively long recovery time, to wit the tip customarily intended for rectifying at 50 HZ or 60 HZ. More specifically,, the line retrace time being on the order of 5 microseconds, it is sufficient for the recovery time of this diode to be greater than 5 microseconds. The cathode of diode $D'_3$ is wired to winding $W_1$ and its anode is wired to the chassis mass. Of course, the control winding $W_3$ and the combination ($R_3$, $C_3$) described when referring to FIG. 1 are eliminated since the third switch $I'_3$ no longer includes a transistor.

Figure 4:
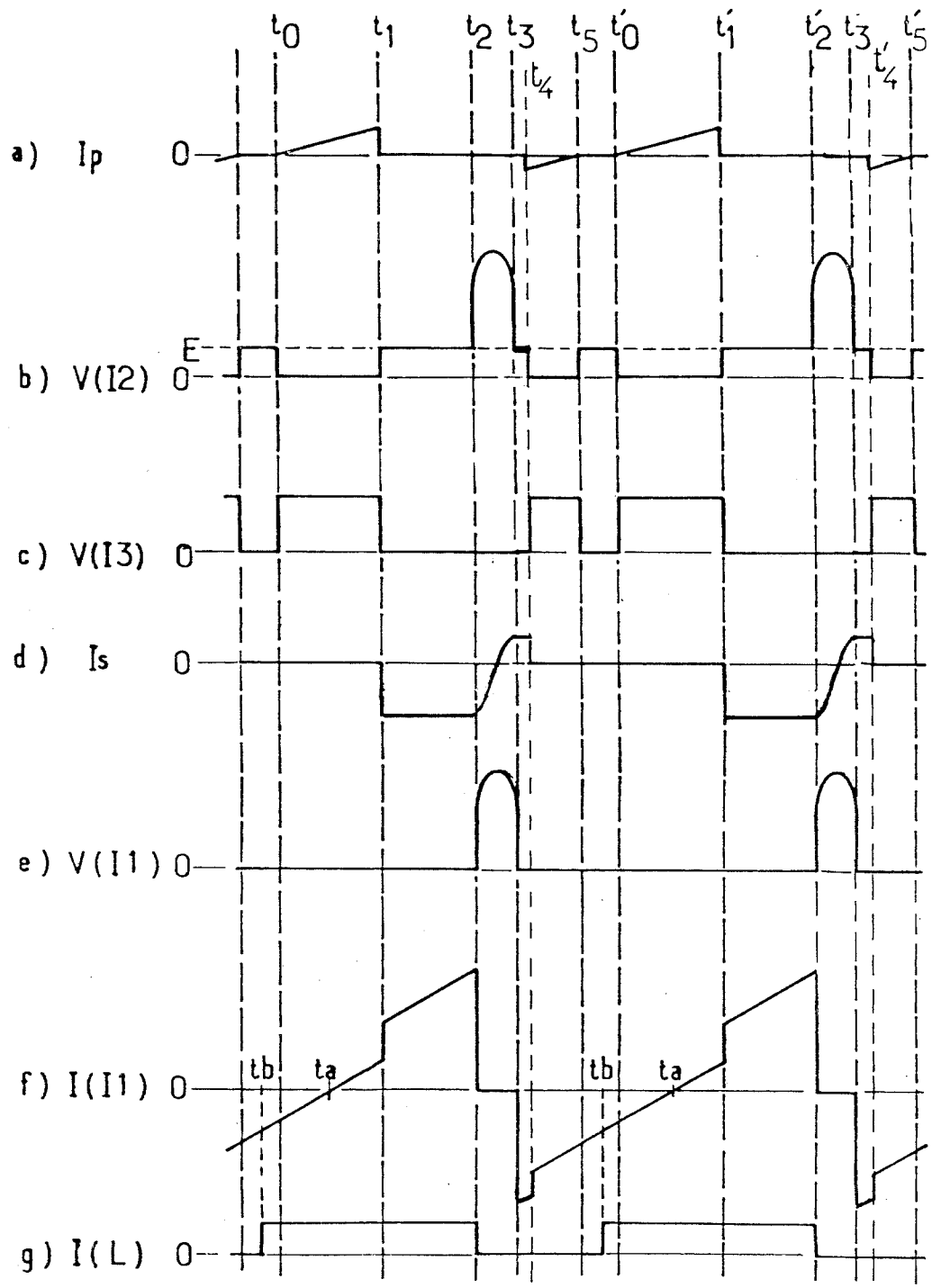
FIG. 4 is a chronogram illustrating the operation of the arrangement of FIG. 3.

The operation of this second mode of realization will be analyzed by referring to the chronogram in FIG. 4. In said chronogram:

FIG. 4a represents the current $I_p$ in winding $W_2$;

FIG. 4b represents the voltage $V(I_2)$ at the terminals of switch $I_2$;

FIG. 4c represents the voltage $V(I'3)$ at the terminals of switch $I'_3$;

FIG. 4d represents the current $I_s$ in winding $W_1$;

FIG. 4e represents the voltage $V(I_1)$ at the terminals of switch $I_1$;

FIG. 4f represents the current $I(I_1)$ passing through switch $I_1$; and

FIG. 4g represents the base current $I(L)$ of transistor $T_1$, i.e., the command signal applied by the oscillator L to the command input of switch $I_1$.

In addition, the different characteristic moments of the operation of the arrangement in FIG. 3 are represented on the abscissa. As the chronogram in FIG. 4 represents essentially two complete operating cycles of the arrangement, a characteristic moment may be analyzed without distinction at either time $t_i$ or time $t'_i$.

We shall first examine the operation of the line deflector Ly in conjunction with the condensers Cs and Cr with which it is able to define two oscillating circuits with different oscillation frequencies depending on the status of the switch $I_1$. The condenser Cs has a capacitance significantly greater than that of the condenser Cr, so that it is condenser Cs which defines, with the inductance of the deflector Ly, the frequency of oscillation during a sweep trace period, whereas the frequency of oscillation during the retrace (higher) is defined by the inductance of the deflector Ly and the capacitance of the condenser Cr. During the sweep trace when the condenser Cr is short-circuited, the transistor $T_1$ may be opened up at a noncritical moment after the sweep begins because the direction of the current in the deflector Ly is such that the oscillating circuit Ly, Cs is reclosed by the diode $D_1$ which is conducting measurably during the first half of the sweep trace, so long as the current is "negative" in accordance with curve f, i.e., until moment $t_a$. The transistor $T_1$ is put in its initial conductive condition before this moment (at $t_b$) by the rising front of the pulse delivered by the line oscillator L (curve g) so that when the diode $D_1$ is automatically locked out when the current changes direction in the deflector Ly at moment $t_a$, the oscillating circuit Ly, Cs may continue to oscillate by virtue of the fact that $T_1$ is saturated until point $t_2$ (or $t'_2$), this moment being marked by the descent edge of the signal delivered by the line oscillator L which initiates the retrace of the sweep. At this instant, $t_2$, the transistor $T_1$ is locked out. At this time the oscillating circuit changes its characteristic frequency because it then consists essentially in the deflector Ly and the condenser Cr. Of course, said condenser Cr is discharged at the start of the retrace sweep. However, the current in the deflector Ly is at a high level so that this inductance is discharged in the condenser and the current in Ly will decrease gradually (Ly "charging" Cr) while causing a "positive" voltage, i.e., blocking the diode $D_1$, at the terminals of the condenser Cr; thus the energy of the induction of the deflector Ly cannot be transferred except to condenser Cr since the switch $T_1$ is open. Accordingly, the current in the deflector Ly will decrease gradually until it is nil in the middle of the line retrace. At this precise instant (the middle of the line retrace), energy is thus at its maximum level in the condenser Cr, which will begin to discharge into the deflector Ly causing a current to flow there in the opposing direction, this until the end of the line retrace.

At this moment ($t_3$ or $t'_3$), the energy in the deflector is again at a peak but the current is reversed. This meets the conditions for the automatic stoppage of the retrace sweep because, when the deflector Ly is again going to start its discharge process, it can happen only by charging the condenser Cr with a "negative" polarity which immediately results in the diode $D_1$ being in the conducting state, in other words, in the automatic closing of the switch $I_1$. As from this moment, the operating conditions, in particular the oscillation frequency of the line sweep circuit, again change because the condenser Cr is again short-circuited. A new sweep trace cycle is thus begun with an oscillating circuit (Ly, Cs). Note that at the end of the retrace (instant $t_3$, $t'_3$), there is absolutely no need for the transistor $T_1$ to be saturated since the condenser Cr is short-circuited automatically when diode $D_1$ begins conducting. The conduction of the transistor $T_1$ will not be involved until later, at the moment when the rising front of the line oscillator L signal, so that the transistor $T_1$ is prepared to conduct at the moment ($t_a$) when the current in the switch $I_1$ changes directions (curve f), i.e., when the diode $D_1$ no longer provides conduction.

Further, note that the winding $W_1$ is in fact connected, during the retrace, to the terminals of an energy source constituted by the oscillating circuit (Ly, Cr); the condenser Cr is developing a positive voltage at the terminals of the winding $W_1$, because the switch $I'_3$ is closed and the other end of this winding $W_1$ is thus connected to the chassis mass. More specifically, during the first part of the retrace, the switch $I'_3$ is closed by the normal conduction of the diode $D'_3$ at $t_1$ and remains closed after the change in sign of the current $I_s$ in winding $W_1$ for the simple reason that a diode $D'_3$ with a relatively long recovery time has been used. In FIG. 4, the recovery time is the time interval between the middle of the line retrace (mid-point of interval $t_2-t_3$) and moment $t_4$, which may vary from one circuit to another (depending on the characteristics of the diode) without problems provided that moment $t_4$ is always after the end of the retrace line $t_3$. At this time, the switch $I_1$ closes and winding $W_1$ is short-circuited until moment $t_4$. Therefore the value of the current $I_2$ does not change during the interval ($t_3-t_4$).

At moment $t_4$, the diode ceases conducting in the "recovery mode" (curve d) and all the voltages at the terminals of the various windings are suddenly reversed. As a consequence, the diode $D_2$ is instantaneously in conducting status, which is reflected in the immediate appearance of a current in winding $W_2$ (curve a, moment $t_4$). This point should be stressed as it may be noted, in comparing curves d and a, that the system is designed so that switches $I_2$ and $I'_3$ operate naturally in phase opposition; the change in the status of switch $I'_3$ at moment $t_4$ results in a change in the status of switch $I_2$ by the simple effects of the laws of electromagnetism, which dictate that, when the current circulating in a coil is cut off, a reverse voltage immediately appears at its terminals. Consequently, the sudden cut-off of a sizable current Is in the winding $W_2$ (curve d) upon locking out the diode $D'_3$ ($t_4$) is instantaneously compensated by the appearance of a current $I_p$ in winding $W_2$. There is thus conservation of the ampere-turns in the magnetic circuit constituted by the core N which, otherwise (i.e., if the current $I_p$ were unable to circulate in the winding $W_2$ because the switch $I_2$ does not open simultaneously), would be dissipated in the form of heat while engendering overvoltages in the other windings $W_4$, $W_5$, $W_6$, etc. In other terms, the fact that one winding ($W_2$) is precisely in the conducting status at the precise moment when another winding ($W_1$) is disconnected ensures that there will be a transfer to winding $W_2$ of all the energy stored in winding $W_1$, thereby keeping that energy from being distributed, especially to the other windings, causing harmful overvoltages in them.

Starting at instant $t_3$, the winding $W_1$ thus plays its role as primary, but the current (which is "negative" as shown in curve a) which is suddenly established in this winding when the diode $D_2$ begins to conduct is of reverse polarity to that which tends to be imposed by the source of continuous voltage E connected to the other terminal of this winding. Consequently, for a certain time interval ($t_4 - t_5$), the current in winding $W_2$ is decreasing in absolute value until it becomes nil and remains nil until transistor $T_2$ is closed, the command for which is generated by the regulating unit R. From moment $t_5$ when transistor $t_2$ begins to conduct (moment $t'0$), the transformer is under no load and the voltages at the terminals of windings $W_1$, $W_2$ are nil. This time interval is more or less long and depends on the control signals generated by the regulating unit R. At the command to close the transistor $T_2$, the current imposed by the source E will increase for the entire time interval $t'0 - t'1$, when the regulating devices will maintain the conduction of the transistor $T_2$. The energy stored during this time in winding $W_2$ thus depends only on the voltage of source E and the time interval $t'0 - t'1$ which can vary depending on how it is regulated, especially in order to compensate for possible variations in the sector voltage. When transistor $T_2$ opens, the current in winding $W_2$ is suddenly cut off and the conditions again exist for a simultaneous and phase-opposed commutation of the switches $I_2$ and $I_3$. In fact, when the current in winding $W_2$ is suddenly cut off (curve a, moment $t'_1$), the voltages at the terminals of winding $W_1$ and the other windings are suddenly reversed, which instantaneously puts diode $D'_3$ in the conducting state (in other words, the switch $I'_3$ closes automatically) and, as this occurs during a sweep trace period, the switch $I_1$ is closed so that a current may instantaneously pass through winding $W_1$, whose terminals are short-circuited. For the same reasons described above, any dissipation or overvoltage is avoided in the system by the fact that one winding ($W_1$) is caused to conduct at the precise moment the current is cut off in another winding ($W_2$). Another important characteristic of the invention also becomes clearly apparent at the present stage of description of the operation, namely that winding $W_1$ is never short-circuited (switches $I'_3$ and $I_1$ closed at the same time) when winding $W_2$ is effectively connected to the power source E ($I_2$ closed), which makes possible a very close coupling between windings $W_1$ and $W_2$ (as noted earlier, windings $W_1$ and $W_2$ may to good advantage be wound on the same "leg" of the core or magnetic circuit of the line transformer) and, consequently, a very low level of line transformer radiation is ensured and poses no risk of interfering with the operation of the other elements of the television set, especially the cathode-ray tube which is extremely sensitive to parasite fields. During time interval $t'_1 - t'_2$—the length of which may be varied by regulating unit R—the winding $W_1$ again has its role of "primary" but carries out no functions other than conserving the energy in the core N of the line transformer at the level at which it had provisionally been stored during time interval $t'0 - t'1$.

Thereafter, the descending front of the pulse generated by the line oscillator L controls the opening of the switch $I_1$ at moment $t'_2$ and a new retrace is initiated in accordance with the process described earlier.

Of course, the invention is in no way limited to the modes of realization of the arrangement which have just been described. In particular, the windings $W_1$ and $W_2$ are represented as being galvanically independent. This is of course the condition of galvanic insulation of the television chassis vis-a-vis the sector. However, if it is felt that this galvanic insulation is not essential, it is possible to combine the winding of windings $W_1$ and $W_2$ in an auto-transformer structure. At most, if there is a desire to further simplify the circuit by adopting a transformation ratio equal to 1 between the two windings $W_1$ and $W_2$, then it is possible to save one winding by combining windings $W_1$ and $W_2$: this is to say that the invention covers all the technical equivalents of the measures involved if said equivalents do so within the framework of the following claims.

I claim:

1. A process for maintaining an electric oscillation circuit with two sequentially commutable oscillation frequencies for the line sweep of a cathode-ray tube, of the type inducing the keep-alive energy level in a first inductive winding connected to said electric oscillation circuit at the common terminal of two of that circuit's condensers, with the lowest oscillation frequency being established for the sweep trace period of the sweep cycle when that condenser is short-circuited and the highest oscillation frequency being established during the retrace period of the sweep when that condenser is not short-circuited, said process being characterized by the fact that, by means of a second inductive winding which may be connected to a source of continuous voltage and coupled to said first winding with a high electromagnetic coupling coefficient by means of a magnetic circuit, it consists in:

interconnecting the aforesaid second winding to the terminals of said continuous voltage source during each sweep trace period referred to above until a predetermined energy level is reached in said magnetic circuit, while keeping the aforesaid first winding disconnected;

disconnecting said second winding when said energy level is reached, preferably while simultaneously connecting said first winding to the terminals of the aforesaid short-circuited condenser until the end of the said sweep trace period if the energy level referred to is reached before the end of that sweep trace period;

breaking the short-circuit at the terminals of said condenser during the entire retrace period, while keeping the aforesaid first winding connected during at least part of that retrace period; and again disconnecting the aforesaid first winding, preferably at the end of the retrace, and connecting the aforesaid second winding to the terminals of said source of continuous voltage.

2. The procedure according to claim 1, characterized by the fact that said first winding is disconnected and the second winding is simultaneously connected to the terminals of said source of continuous voltage at the end of said retrace period.

3. The procedure according to claim 2, characterized by the fact that said second winding is connected to the terminals of said source of continuous voltage only during the first part of the following sweep trace period until such time as an energy level close to nil is reached in said magnetic circuit.

4. A horizontal deflection device for a cathode-ray tube, the device including:

an oscillating circuit wired to a first inductive winding ($W_1$) and including the deflector (Ly) of the said cathode-ray tube as well as two condensers (Cr, Cs), one of these condensers (Cr) being connected between a connection terminal of the said first winding to the said oscillating circuit and a reference potential terminal;

a first controlled switch ($I_1$) connected to the terminals of that condenser (Cr) in order to short-circuit it during each sweep trace period and to place it in service in the aforesaid oscillating circuit during each retrace period of the sweep; and a second inductive winding ($W_2$) coupled to the first winding and connected to a source of continuous voltage (E) through a second controlled switch ($I_2$);

said arrangement being characterized by the fact that the magnetic coupling between the aforesaid first ($W_1$) and second ($W_2$) windings is close and by the fact that it also includes a third switch ($I_3$, $I'_3$) in series with the aforesaid first winding ($W_1$) between the said reference potential terminal and the said connection point.

5. A device according to claim 4, characterized by the fact that said third switch ($I'_3$) is a diode ($D'_3$) with a relatively long recovery time taking into account the characteristic period of said oscillating circuit including the said deflector.

6. A device according to claim 4 or 5, characterized by the fact that the said diode ($D'_3$) with a relatively long recovery time is wired in between a terminal of the said first winding ($W_1$) and a point on the reference potential.

7. A device according to claim 5 or 6, characterized by the fact that the diode ($D'_3$) in question has a recovery time at least equal to half the sweep retrace period of said deflector (Ly).

8. A device according to one of claims 5 to 7, characterized by the fact that said diode ($D'_3$) has a recovery time greater than 5 microseconds.

9. A device according to one of claims 5 to 8, characterized by the fact that said diode ($D'_3$) is of a type customarily intended for the rectification of alternating current from a 50 HZ or 60 HZ distribution network.

10. A device according to claim 4, characterized by the fact that the aforesaid third switch ($I_3$) is a controlled switch in that it also includes drive mechanisms ($W_3$) to drive the second and third controlled switches in phase opposition.

11. A device according to claim 10, characterized by the fact that the said third controlled switch $I_3$ is wired between a terminal of said first winding ($W_1$) and a point on the said reference potential and that the aforesaid drive mechanisms include notably an additional winding ($W_3$) wound about said magnetic circuit, one end of which is connected to a point on said reference potential and the other end of which is connected to a control input ($T_3$) of said third switch; the coupling between said first winding ($W_1$) and said additional winding ($W_3$) is preferably close.

12. A device according to one of claims 4 to 11, characterized by the fact that at least one of the controlled switches ($I_1$, $I_2$, $I_3$) referred to above is a bidirectional switch controllable in one conduction direction.

13. A device according to claim 12, characterized by the fact that said switch consists of a transistor ($T_1$, $T_2$) and a rapid diode ($D_1$, $D_2$) connected with reverse polarity between the collector and the emitter of the said transistor, with the base of the transistor constituting a command input of the said switch.

14. A device according to one of claims 4 to 13, characterized by the fact that the said second controlled switch ($I_2$) is driven by a regulating system (R) to regulate the current in said deflector in sweep retraces.

15. A device according to claim 14, characterized by the fact that is also includes at least one stabilized power supply feed winding ($W_4$, $W_6$) coupled magnetically to the said first winding and associated with a rectifier, the direction of wind of said winding and the direction of the wiring in of said rectifier being selected in order that the latter be active only during said retrace period.

16. Device according to one of claims 4 to 15, characterized by the fact that it also includes at least one unstabilized feed winding ($W_5$) coupled magnetically to the second winding and associated with a rectifier, the direction of wind of said winding and the direction of the winding in of said rectifier being selected so that the latter be active only during said sweep trace period.

* * * * *